(12) United States Patent
Baringhaus (10) Patent No.: US 12,255,252 B2
(45) Date of Patent: Mar. 18, 2025

(54) VERTICAL FIELD-EFFECT TRANSISTOR AND METHOD FOR FORMING SAME

(71) Applicant: Robert Bosch GmbH, Stuttgart (DE)

(72) Inventor: Jens Baringhaus, Sindelfingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 444 days.

(21) Appl. No.: 17/636,223

(22) PCT Filed: Jul. 1, 2020

(86) PCT No.: PCT/EP2020/068524
§ 371 (c)(1),
(2) Date: Feb. 17, 2022

(87) PCT Pub. No.: WO2021/037422
PCT Pub. Date: Mar. 4, 2021

(65) Prior Publication Data
US 2022/0285542 A1  Sep. 8, 2022

(30) Foreign Application Priority Data
Aug. 23, 2019  (DE) .................. 10 2019 212 641.3

(51) Int. Cl.
*H01L 31/072* (2012.01)
*H01L 29/06* (2006.01)
(Continued)

(52) U.S. Cl.
CPC ...... *H01L 29/7788* (2013.01); *H01L 29/0607* (2013.01); *H01L 29/66462* (2013.01); *H01L 29/7787* (2013.01)

(58) Field of Classification Search
CPC ............. H01L 29/7788; H01L 29/0607; H01L 29/66462; H01L 29/7787; H01L 29/2003;
(Continued)

(56) References Cited

U.S. PATENT DOCUMENTS

2012/0319127 A1  12/2012  Chowdhury et al.
2017/0125574 A1  5/2017  Chowdhury et al.
(Continued)

FOREIGN PATENT DOCUMENTS

DE    102017215296 A1    3/2019

OTHER PUBLICATIONS

International Search Report for PCT/EP2020/068524, Issued Sep. 9, 2020.

*Primary Examiner* — Theresa T Doan
(74) *Attorney, Agent, or Firm* — NORTON ROSE FULBRIGHT US LLP; Gerard A. Messina (57) ABSTRACT

A vertical field effect transistor, including a drift region having a first conductivity type, a trench structure on or above the drift region, a shielding structure, and a source/drain electrode. The trench structure includes at least one side wall at which a field effect transistor (FET) channel region is formed. The FET channel region includes a III-V heterostructure for forming a two-dimensional electron gas at a boundary surface of the III-V heterostructure. The shielding structure is situated laterally adjacent to the at least one side wall of the trench structure and extends vertically into the drift region or vertically further in the direction of the drift region than the trench structure. The shielding structure has a second conductivity type that differs from the first conductivity type. The source/drain electrode is electroconductively connected to the III-V heterostructure of the trench structure and to the shielding structure.

13 Claims, 9 Drawing Sheets

(51) Int. Cl.
  *H01L 29/66* (2006.01)
  *H01L 29/778* (2006.01)
  *H01L 31/109* (2006.01)

(58) Field of Classification Search
  CPC ............... H01L 21/761; H01L 29/0619; H01L 29/0623; H01L 29/1066; H01L 29/7789; H01L 29/0646
  USPC ........................................................ 257/194
  See application file for complete search history.

(56) References Cited

U.S. PATENT DOCUMENTS

2017/0373200 A1  12/2017  Shibata et al.
2018/0350965 A1* 12/2018  Shibata ............... H01L 29/7789

* cited by examiner

VERTICAL FIELD-EFFECT TRANSISTOR AND METHOD FOR FORMING SAME

FIELD

The present invention relates to a vertical field effect transistor and a method for forming same.

BACKGROUND INFORMATION

Figure 1:
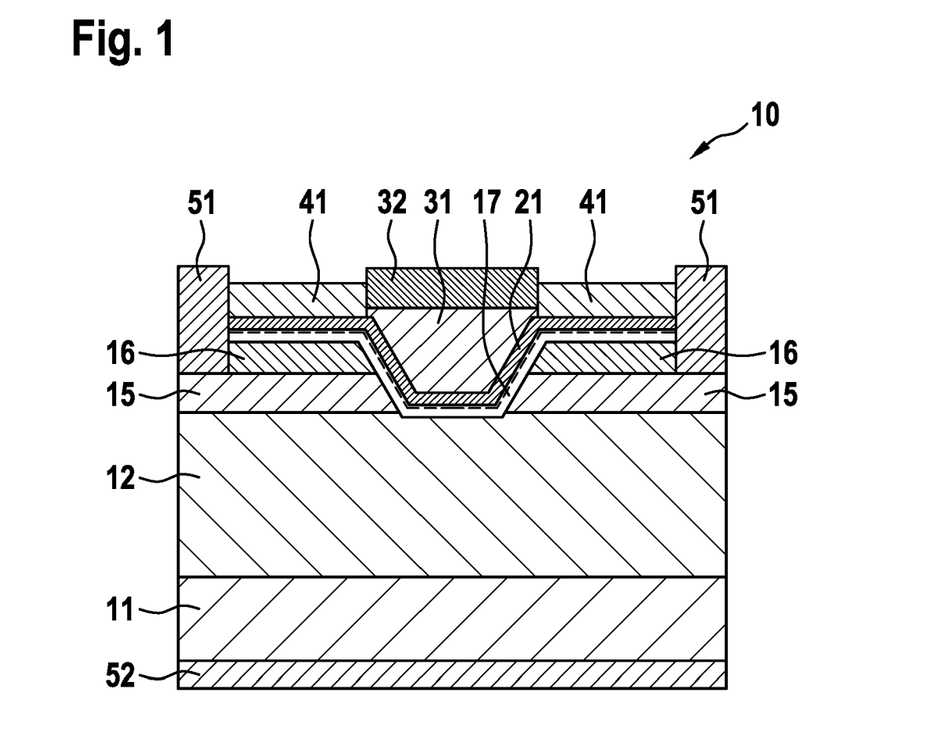
FIG. 1 shows a sectional illustration of a transistor structure of the applied technology.

Transistors based on gallium nitride (GaN) provide the option of implementing components with lower ON resistances, at the same time with higher breakdown voltages, than comparable components based on silicon or silicon carbide. One possible design of such a transistor 10 of the applied technology, illustrated in FIG. 1, is the so-called vertical high electron mobility transistor (HEMT), in which the channel is formed by a two-dimensional electron gas (2DEG) at the boundary surface of an aluminum gallium nitride (AlGaN)/gallium nitride (GaN) heterostructure. The heterostructure is formed in a V-shaped trench, for example by growing. Transistor 10 includes a conductive GaN substrate 11 to which a weakly n-conductive GaN drift zone 12 is applied. Situated above drift zone 12 is a p-conductive GaN region 15, above which an insulating GaN or AlGaN region 16 is situated. Both regions 15, 16 are penetrated by a V-shaped trench, above which an undoped or intrinsic GaN region 17 and an AlGaN region 21 extend. The 2DEG forms in region 17 at the boundary surface of the two regions 17, 21. A p-conductive GaN region 31 is introduced into the V-shaped trench to ensure a self-blocking ("normally off") operation of the component. A gate electrode 32 contacts p-GaN region 31. A source electrode 51 contacts the 2DEG as well as p region 15. An insulator 41 separates source electrode 51 and gate electrode 32. A drain electrode 52 is situated on the rear side of substrate 11. Without application of a gate voltage, transistor 10 is self-blocking, since the 2DEG below region 31 is depleted. As the result of applying a positive voltage to gate electrode 32, the entire 2DEG is filled with electrons, and the electrons flow from source electrode 51, via the side wall of the trench, into the base of the trench, and from there into drift zone 12, through substrate 11, and into drain electrode 52.

In the blocking mode, transistor 10 has high electrical fields at the base of the trench. As a result, there is a risk of early electrical breakdown of transistor 10, or that the voltage applied to drain electrode 52 may extend through to gate 31, 32.

SUMMARY

An object of the present invention is to provide a vertical field effect transistor and a method for manufacturing same which solve one or multiple of the above-mentioned problems.

According to one aspect of the present invention, the object may be achieved by a vertical field effect transistor. In accordance with an example embodiment of the present invention, the vertical field effect transistor includes: a drift region having a first conductivity type; a trench structure on or above the drift region, the trench structure including at least one side wall at which a field effect transistor (FET) channel region is formed, the FET channel region including a III-V heterostructure for forming a two-dimensional electron gas at a boundary surface of the III-V heterostructure; and a shielding structure that is situated laterally adjacent to the at least one side wall of the trench structure and extends vertically into the drift region or vertically further in the direction of the drift region than the trench structure, the shielding structure having a second conductivity type that differs from the first conductivity type, and a source/drain electrode that is electroconductively connected to the III-V heterostructure of the trench structure and to the shielding structure.

The shielding structure allows shielding of the base of the trench structure from electrical fields. This allows the full capability of the transistor to be exploited. This prevents, for example, an early electrical breakdown of the transistor, or the voltage, applied to the drain electrode, from extending through to the gate electrode.

According to a further aspect of the present invention, the object may be achieved by a method for forming a vertical field effect transistor. In accordance with an example embodiment of the present invention, the method includes: forming a drift region having a first conductivity type; forming a trench structure on or above the drift region, the trench structure including at least one side wall at which a field effect transistor (FET) channel region is formed, the FET channel region including a III-V heterostructure for forming a two-dimensional electron gas at a boundary surface of the III-V heterostructure; forming a shielding structure that is situated laterally adjacent to the at least one side wall of the trench structure and extends vertically into the drift region or vertically further in the direction of the drift region than the trench structure, the shielding structure having a second conductivity type that differs from the first conductivity type; and forming a source/drain electrode that is electroconductively connected to the III-V heterostructure of the trench structure and to the shielding structure.

Refinements of the aspects of the present invention are disclosed herein. Specific example embodiments of the present invention are illustrated in the figures and explained in greater detail below.

DETAILED DESCRIPTION OF EXAMPLE EMBODIMENTS

In the following detailed description, reference is made to the figures, which constitute part of this description and which show specific embodiments for purposes of illustration, and via which the present invention may be carried out.

It is understood that other exemplary embodiments may be used, and structural or logical changes made, without departing from the scope of protection of the present invention. It is understood that the features of the various exemplary embodiments described herein may be combined with one another unless specifically stated otherwise. The following detailed description is therefore not to be construed in a limiting sense. In the figures, identical or similar elements are provided with the same reference numerals when appropriate.

FIGS. 2A through 6B show views of a vertical field effect transistor 100 according to various specific embodiments. In various specific embodiments, a vertical field effect transistor 100 includes a drift region 112; a trench structure 102 on or above drift region 112, a shielding structure 118, 119, a first source/drain electrode 151 (a source electrode, for example), a second source/drain electrode 152 (a drain electrode, for example), and a gate trench (which extends in the plane of the drawing and is also referred to as a trench structure; illustrated in a top view in FIGS. 4C and 5A). In the following discussion, it is assumed as an example that first source/drain electrode 151 is a source electrode, and that second source/drain electrode 152 is a drain electrode. Drift region 112 has a first conductivity type, and shielding structure 118, 119 has a second conductivity type that differs from the first conductivity type. Trench structure 102 includes at least one side wall at which a field effect transistor FET channel region is formed, the FET channel region including a III-V heterostructure 117, 121 for forming a two-dimensional electron gas (2DEG) at a boundary surface of the III-V heterostructure. Shielding structure 118, 119 is situated laterally adjacent to the at least one side wall of trench structure 102 and extends vertically into drift region 112 or vertically further in the direction of drift region 112 than trench structure 102. Source electrode 151 is electroconductively connected to the III-V heterostructure of trench structure 102 and to shielding structure 118, 119. For example, source electrode 151 is made of a metal or a metal alloy, and shielding structure 118, 119 is made of doped semiconducting material.

Areas 119 of shielding structure 118, 119 have a higher dopant concentration than drift region 112. It is possible to shield base 101 of trench structure 102 by introducing shielding areas 119, for example in the form of highly doped p-GaN regions, into drift region 112. During operation, a space charge region may be formed between areas 119 of shielding structure 118, 119 and drift region 112. The area in which a current may flow is thus reduced, as the result of which the resistance may be increased. By introducing shielding structure 118, 119, the total resistance of field effect transistor 100 is increased compared to the variant without a shielding structure (FIG. 1). The potential that is present at drain electrode 152 in the blocked case results in an electrical field whose maximum is directly below the shielding structure 118, 119, and not in base 101 of trench structure 102, as in the case without shielding structure 118, 119 (cf. FIG. 1). This prevents, for example, an early electrical breakdown of transistor 100, or the voltage, applied to drain electrode 152, from extending through to a gate electrode 132.

Field effect transistor 100 may also include a conductive GaN substrate 111 to which a weakly n-conductive GaN drift zone 112 is applied. A p-conductive GaN region 115 may be formed above drift zone 112, and an insulating GaN or AlGaN region 116 may be formed above the p-conductive GaN region. Both regions 115, 116 are penetrated by a V-shaped trench, above which an undoped or intrinsic GaN region 117 and an AlGaN region 121 may extend. The 2DEG may form in region 117 at the boundary surface of the two regions 117, 121. A p-conductive GaN region 131 may be introduced into the V-shaped trench to ensure a self-blocking (normally off) operation of field effect transistor 100. Gate electrode 132 may contact p-GaN region 131. Source electrode 151 may contact the 2DEG as well as p region 115. An insulator 141 may electrically insulate source electrode 151 and gate electrode 132 from one another. Drain electrode 152 may be situated on the rear side of substrate 111. Without application of a gate voltage, field effect transistor 100 may be self-blocking, since the 2DEG below region 131 may be depleted. As the result of applying a positive voltage to gate electrode 132, the entire 2DEG may be filled with electrons, and the electrons may flow from source electrode 151, via the side wall of trench structure 102, into base 101 of trench structure 102, and from there may pass into drift zone 112, through substrate 111, and into drain electrode 152.

Figure 2A:
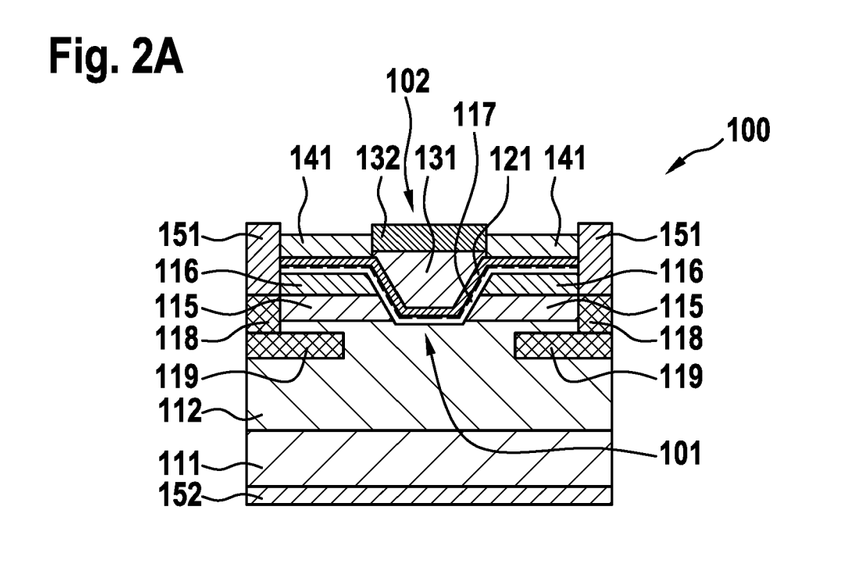
FIGS. 2A, 2B, 2C, and 2D show views of a vertical field effect transistor according to various specific embodiments of the present invention.
Figure 2B:
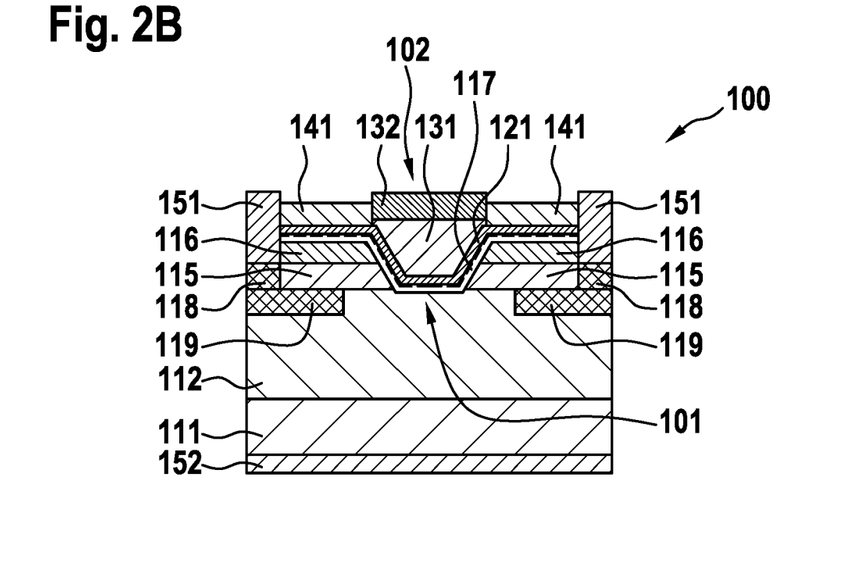

In further specific embodiments, shielding structure 118, 119 may also be formed directly below p-conductive region 115, as illustrated in FIG. 2B. Shielding structure 118, 119 may include further highly doped p-conductive regions 118 that connect areas 119 of shielding structure 118, 119 to source electrode 151. This enables a better electrical connection.

Figure 2C:
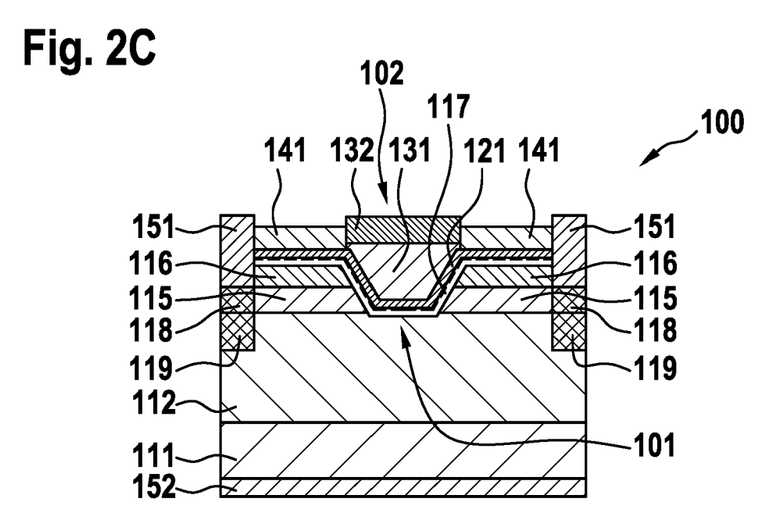
Figure 2D:
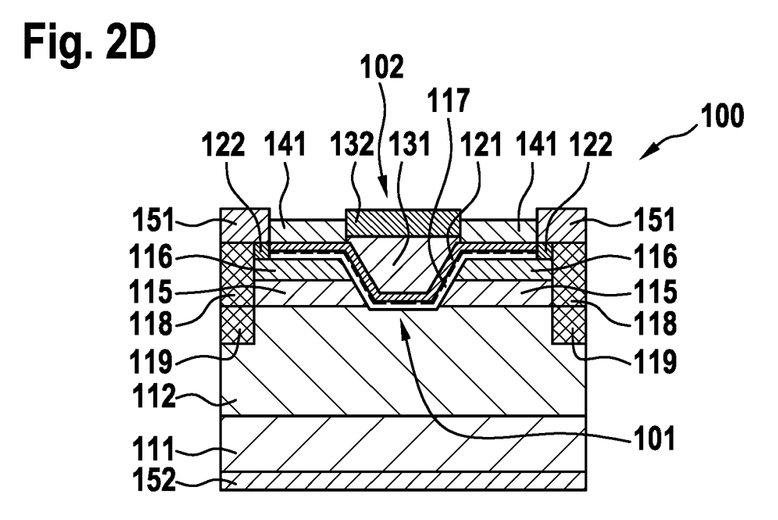

In addition, shielding structure 118, 119 may be configured in such a way that it has the same lateral extension as source electrode 151 (as shown in FIG. 2C), or alternatively may be configured in such a way that it has a smaller lateral extension than the extension of source electrode 151, as illustrated in FIG. 2D. The variation in the lateral extension of shielding structure 118, 119 provides the option for optimizing the component with regard to the shielding (which may become better with an increasingly greater lateral extension) or with regard to the forward resistance (which may become lower with an increasingly smaller lateral extension).

In various specific embodiments, at least one highly doped n-GaN region 122 may be formed that connects source electrode 151 to the 2DEG, as illustrated in FIG. 2D. This may enable an improvement in the connection of the 2DEG to source electrode 151.

Figure 3A:
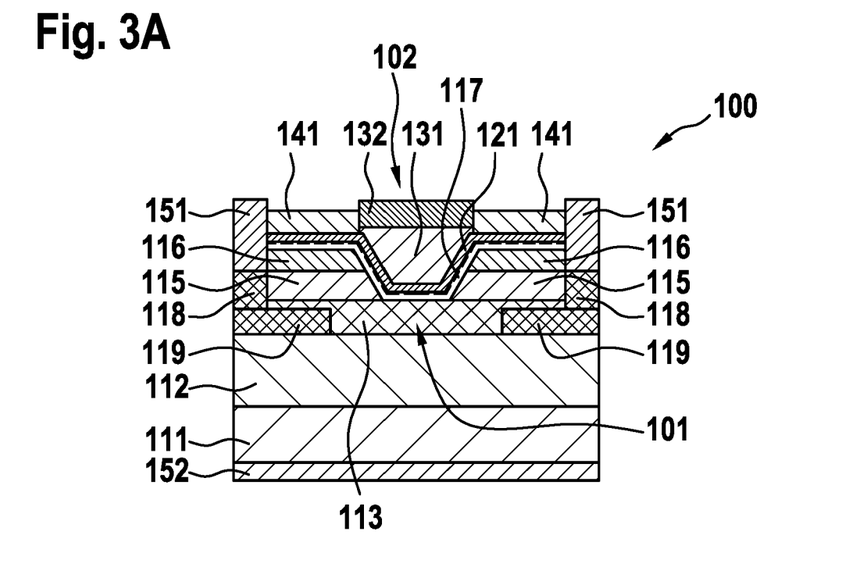
FIGS. 3A and 3B show views of a vertical field effect transistor according to various specific embodiments of the present invention.
Figure 3B:
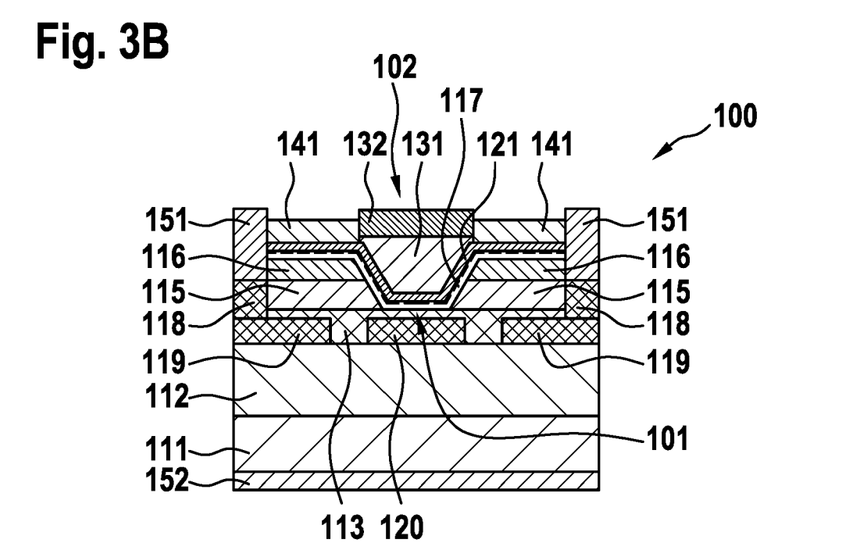
Figure 4A:
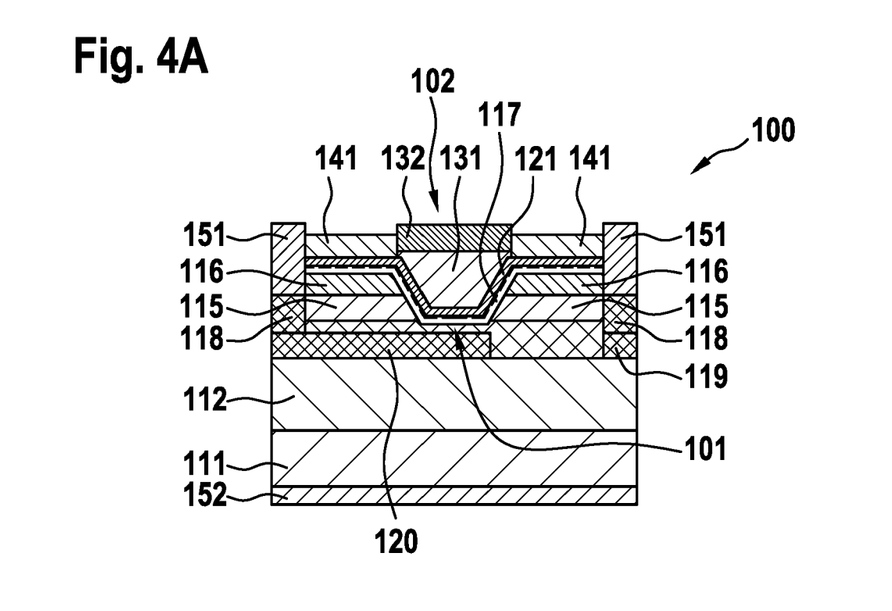
FIGS. 4A, 4B, and 4C show views of a vertical field effect transistor according to various specific embodiments of the present invention.
Figure 4B:
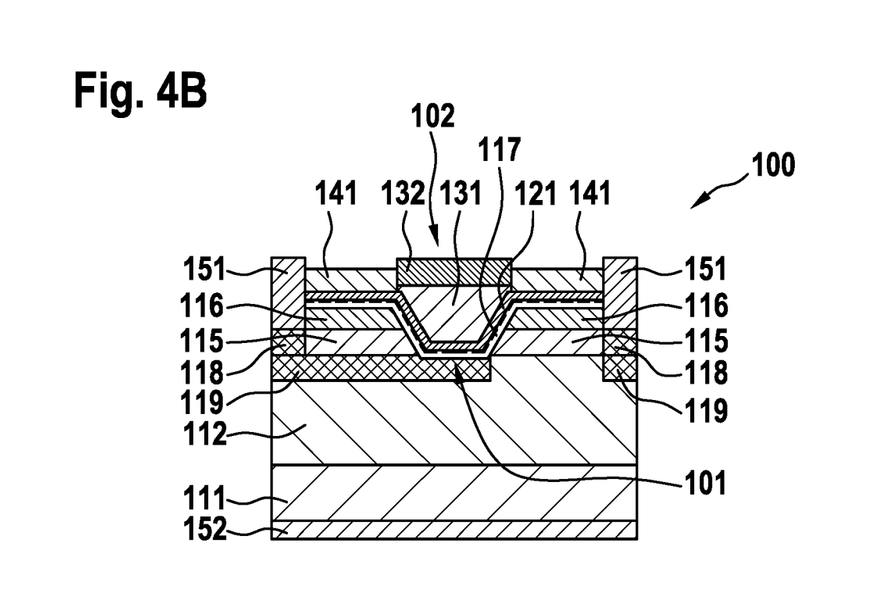
Figure 4C:
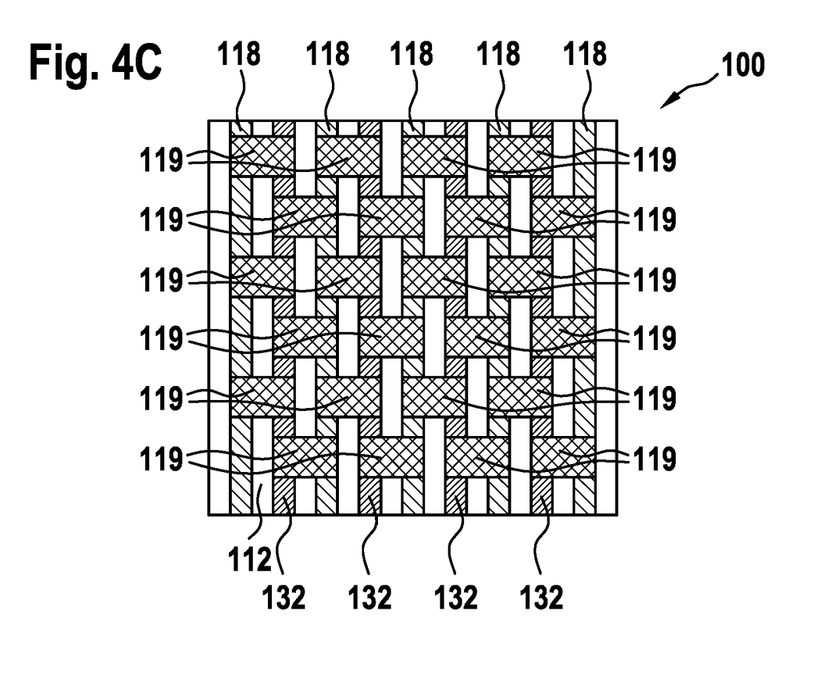

In various specific embodiments, a p-GaN shielding structure 113 may be formed below p-conductive region 115 of trench structure 102, above and/or in drift region 112. For example, in various specific embodiments, a GaN region 113 may be formed between drift region 112 and base 101 of trench structure 102, as illustrated in FIG. 3A. GaN region 113 may be formed, for example, next to at least a portion of shielding structure 118, 119, for example in a shared layer plane. GaN region 113 may, for example, have a higher n-conductive design than drift region 112. This results in a reduction in the extension of the space charge region, as the result of which the increase in resistance may be reduced. In various specific embodiments, a shielding structure 118, 119 is formed on each side of trench structure 102, as shown in FIGS. 2A through 3A. In this case, GaN region 113 may be formed between two shielding areas 119 and/or between two shielding areas 118. In various specific embodiments, further shielding structures may be formed to further increase the shielding effect. For example, a p-conductive region 120 as a shielding structure may be provided (directly) below base 101 of trench structure 102, as illustrated in FIG. 3B. This allows maximum shielding of base 101 of trench structure 102 from electrical fields. In various specific embodiments, effective shielding of base 101 of trench structure 102 is achieved in that shielding structure 118, 119 (for example, a shielding area 119 of the shielding structure) extends to below the base of the trench structure, as illustrated in FIG. 4A (right shielding area 119). In a further specific embodiment, this may also be achieved using a shielding structure 118, 119 that adjoins base 101 of trench structure 102, for example contacts same. In this case, the FET channel formed at the left side wall of the trench structure in FIG. 4B is no longer conductive, since there is no continuous current path from left source electrode 151 to drain electrode 152. In various specific embodiments, shielding areas 119 may be situated in alternation on the right side of the trench structure and the left side of the trench structure, as illustrated in the top view in FIG. 4C. This makes it possible for electrons, which are situated at the left side wall in FIG. 4B, to flow downwardly into an adjacent cell, and in this cell to subsequently discharge in the vertical direction to drain electrode 152. In this way, the entire FET channel may contribute to the current flow.

Figure 5A:
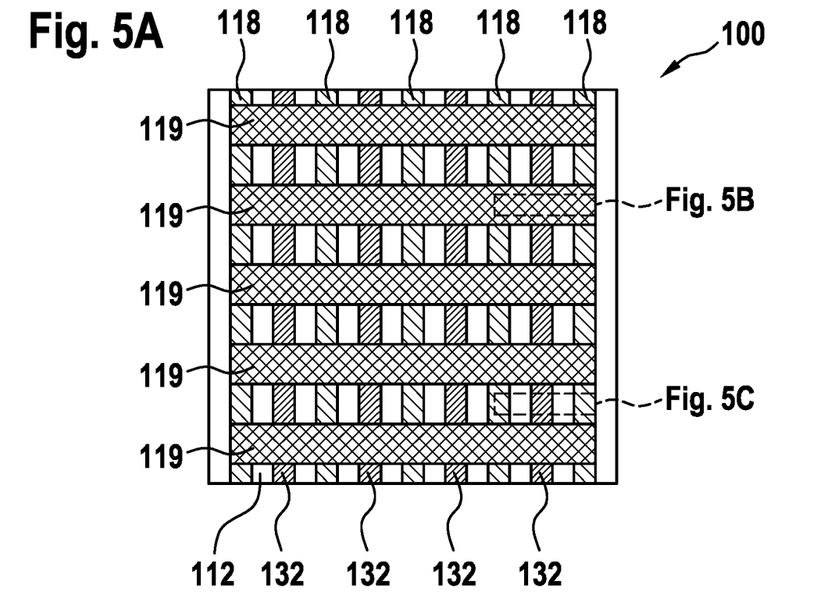
FIGS. 5A, 5B, and 5C show views of a vertical field effect transistor according to various specific embodiments of the present invention.
Figure 5B:
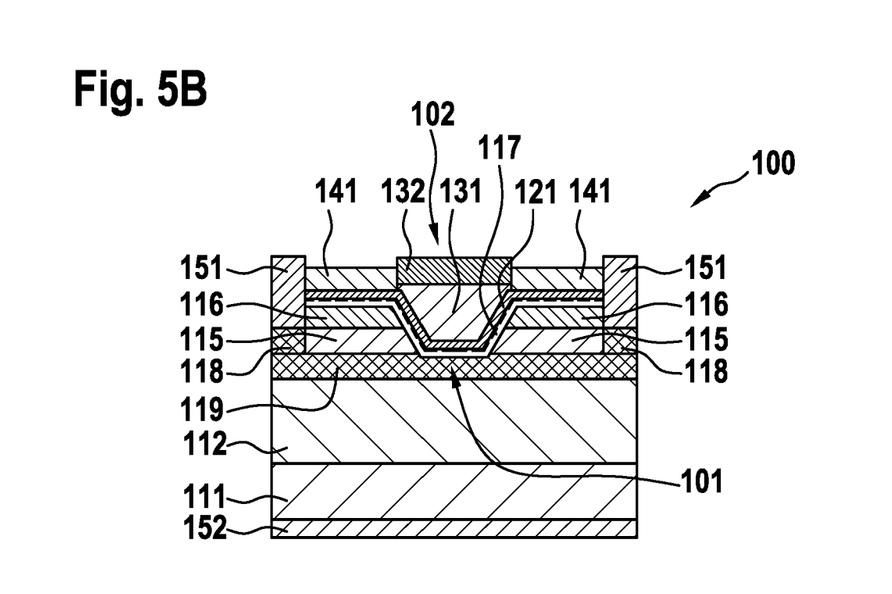
Figure 5C:
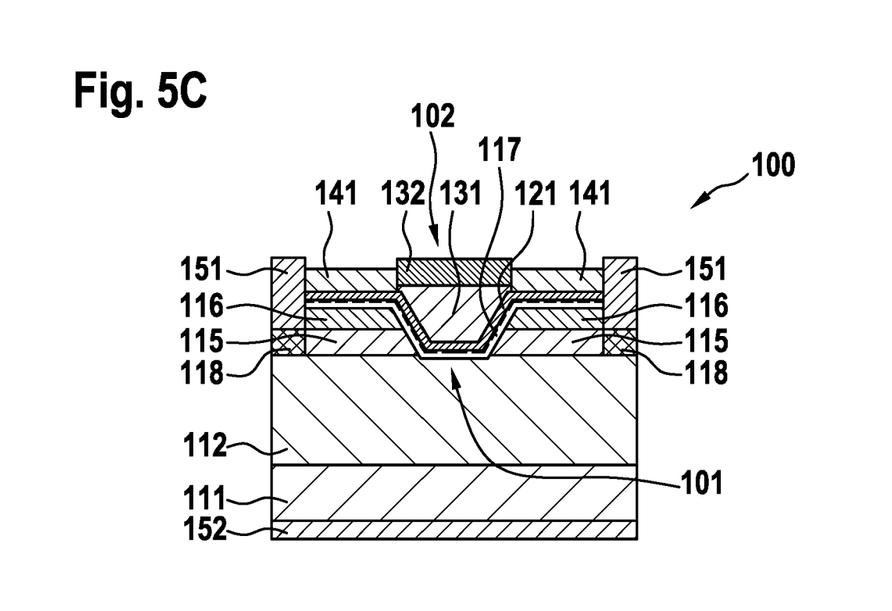

In a further specific embodiment, the lateral structure of shielding areas 119 may be decoupled from the structure of the cell situated thereabove, as illustrated in FIGS. 5A, 5B, and 5C. For example, a shielding area 119 may be designed as a continuous strip-shaped structure that extends in a perpendicular direction relative to the direction in which the gate trenches are extended, as illustrated in FIGS. 5A and 5B. The cells in which a shielding area 119 is designed as a continuous strip-shaped structure below the base of the trench structure (FIG. 5B) do not contribute, or essentially no longer contribute, to the current flow. Strip-shaped shielding areas 119 may also shield the cells in which no shielding area 119 is formed below the base of the trench structure (FIG. 5C). It is thus possible, for example, that the lithographies of the trench structure 102 and of the shielding areas 119 do not necessarily have to be coordinated with one another. The manufacture of field effect transistor 100 may be simplified in this way.

In other words: In various specific embodiments, an additional trench structure 102 may be provided which is offset in the plane with respect to trench structure 102, so that source electrode 151 is situated between trench structure 102 and additional trench structure 102. Shielding structure 118, 119 may include an additional area 119 that is situated in drift region 112 and extends laterally at least to below a portion of the base of additional trench structure 102. Area 119 of shielding structure 118, 119 situated in drift region 112 and additional area 119 of shielding structure 118, 119 situated in drift region 112 may be offset relative to one another in the trench direction. The trench direction is, for example, the elongated (for example, longest or linear) direction of extension of trench structure 102.

Figure 6A:
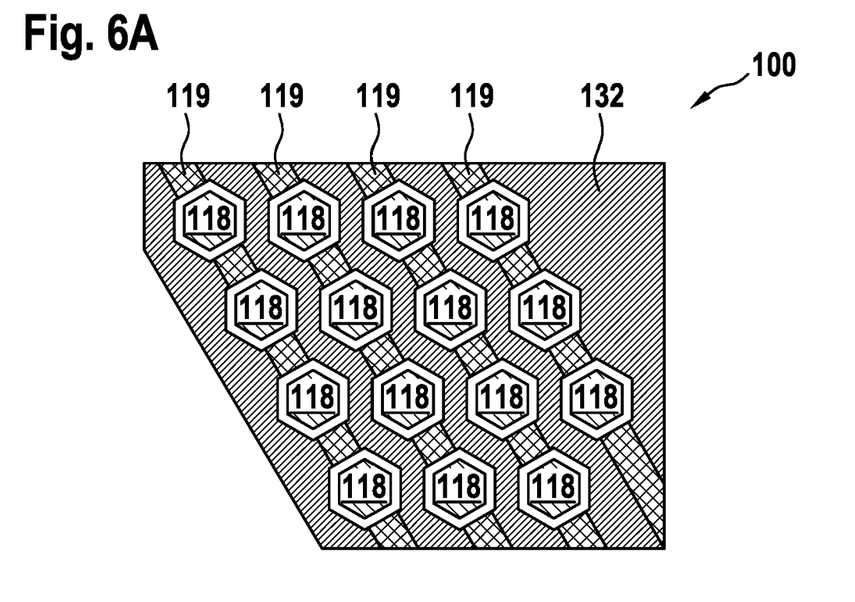
FIGS. 6A and 6B show views of a vertical field effect transistor according to various specific embodiments of the present invention.
Figure 6B:
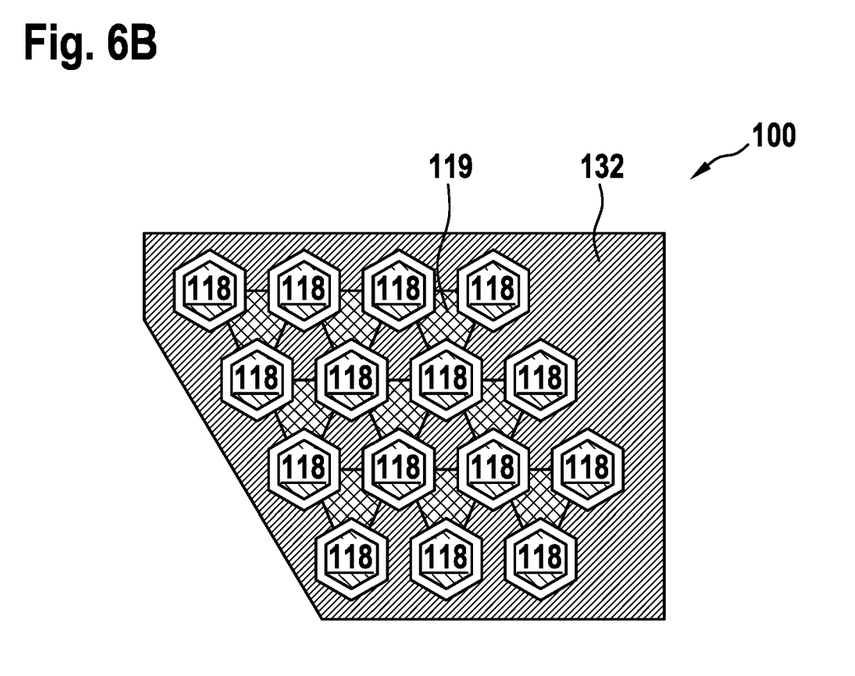

The lateral direction of extension of shielding structure 119 may be selected to be at an arbitrary angle relative to the direction of extension of the gate trench. In addition to a linear design of the gate trench and of the shielding structure, both may also be designed in a grid pattern (hexagonal, for example), as illustrated in FIGS. 6A and 6B. FIG. 6A shows one specific embodiment with a hexagonal gate trench and strip-shaped shielding areas 119. FIG. 6B illustrates one specific embodiment in which the gate trench has a hexagonal pattern. Shielding areas 119 may be formed, for example, at every other base point of the hexagonal grid. In further specific embodiments, other grid patterns for the gate trench and/or for the shielding structure may be provided, for example herringbone grids or cubic grids.

In various specific embodiments, trench structure 102 may include at least one side wall with a FET channel that forms an angle with respect to substrate 111. For example, the side wall of trench structure 102 may encompass an angle with respect to a top side of substrate 111, it being possible for the angle to be greater than 0° and smaller than 90°. III-V heterostructure 117, 121 may include an AlGaN layer 121 and a GaN layer 117 that adjoins AlGaN layer 121. The FET channel may thus include an aluminum gallium nitride (AlGaN) region and a gallium nitride (GaN) region.

Drift region 112 may also be referred to as drift zone 112 of vertical field effect transistor 100. Drift region 112 may include, for example, an n-conductive GaN region 112, for example n-doped GaN. Drift region 112 may be formed on or above a semiconductor substrate 111, for example a GaN substrate 111. Shielding structure 118, 119 may include, for example, at least one p-conductive GaN region 118, 119 whose dopant concentration may be higher than a dopant concentration of drift region 112. For example, drift region 112 may include n-doped GaN, and shielding structure 118, 119 may include p++ doped GaN. Shielding structure 118, 119 may include a p++ GaN region, and may be configured to laterally enclose base 101 of trench structure 102. Vertical field effect transistor 100 may include a p-conductive GaN region 115 that laterally encloses base 101 of trench structure 102. Shielding structure 118, 119 may extend at least partially below p-conductive GaN region 115. Shielding structure 118, 119 may extend through p-conductive GaN region 115 and into n-conductive GaN region 112.

In various specific embodiments, a region 113 that has the first conductivity type may be formed in drift region 112, at least below trench structure 102. Alternatively or additionally, region 113 may have a higher dopant concentration than drift region 112. Area 113 which is formed at least below trench structure 102 may adjoin shielding structure 118, 119, for example may be electroconductively connected thereto. In various specific embodiments, an additional shielding structure 120 may be provided. Additional shielding structure 120 may be situated in region 113 that is formed at least below trench structure 102. Additional shielding structure 120 may have the second conductivity type. Additional shielding structure 120 may be at least partially situated below trench structure 102. In various specific embodiments, additional shielding structure 120 may be separated from shielding structure 118, 119 by region 113 that is formed at least below trench structure 102.

Figure 7:
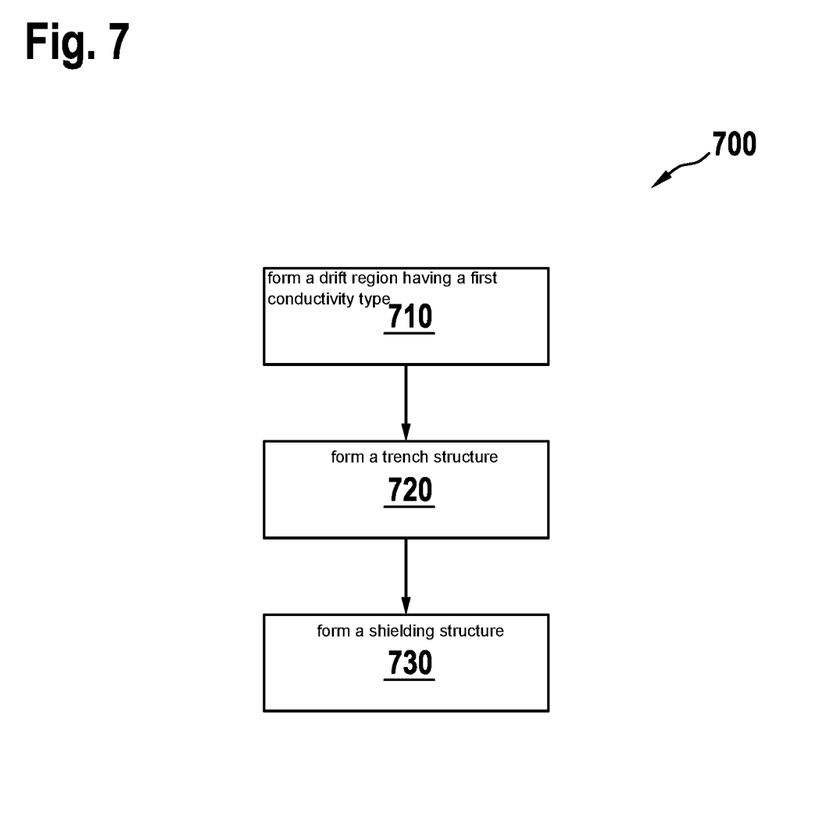
FIG. 7 shows a flowchart of a method for forming a vertical field effect transistor according to various specific embodiments of the present invention.

FIG. 7 shows a flowchart of a method 700 for forming a vertical field effect transistor 100 according to various specific embodiments. Method 700 includes: forming 710 a drift region having a first conductivity type; forming 720 a trench structure on or above the drift region, the trench structure including at least one side wall at which a field effect transistor FET channel region is formed, the FET channel region including a III-V heterostructure for forming a two-dimensional electron gas at a boundary surface of the III-V heterostructure; and forming 730 a shielding structure that is situated laterally adjacent to the at least one side wall of the trench structure and extends vertically into the drift region or vertically further in the direction of the drift region than the trench structure, the shielding structure having a second conductivity type that differs from the first conductivity type, and forming a source/drain electrode that is electroconductively connected to the III-V heterostructure of the trench structure and to the shielding structure.

The trench structure may be formed on or above a semiconductor substrate. The trench structure may be formed with a base. The drift region is formed between the base of the trench structure and the semiconductor substrate. The shielding structure may be formed between the trench structure and the drift region. The shielding structure may be indirectly electroconductively connected to the trench structure, for example via the source electrode.

The shielding structure may clearly extend beyond the base of the trench structure in the direction of the semiconductor substrate. In various specific embodiments, the area between the base of the trench structure and the semiconductor substrate may remain free of a shielding structure.

The specific embodiments that are described, and shown in the figures, have been selected only as examples. Different specific embodiments may be combined with one another, either completely or with respect to individual features. In addition, one specific embodiment may be supplemented by features of another specific embodiment. Furthermore, described method steps may be repeated, and carried out in an order different from that described. In particular, the present invention is not limited to the method that is stated.

What is claimed is:

1. A vertical field effect transistor, comprising:
   a drift region having a first conductivity type;
   a trench structure on or above the drift region, the trench structure including at least one side wall at which a field effect transistor (FET) channel region is formed, the FET channel region including a III-V heterostructure for forming a two-dimensional electron gas at a boundary surface of the III-V heterostructure;
   a shielding structure that is situated laterally adjacent to the at least one side wall of the trench structure and extends vertically into the drift region or vertically further in a direction of the drift region than the trench structure, the shielding structure having a second conductivity type that differs from the first conductivity type; and
   a source/drain electrode that is electroconductively connected to the III-V heterostructure of the trench structure and to the shielding structure;
   wherein the vertical field effect transistor includes at least one of the following four features (I)-(III):
   (I) (i) the III-V heterostructure includes an AlGaN layer and a GaN layer that adjoins the AlGaN layer, (ii) the drift region is n-conductive, and (iii) the shielding structure includes at least one p-conductive GaN region whose dopant concentration is higher than a dopant concentration of the drift region;
   (II) the shielding structure includes a laterally extending area that is situated in the drift region and extends laterally in a direction of the trench structure, and the vertical field effect transistor further includes at least one of the following two features (i)-(ii):
     (i) the laterally extending area of the shielding structure situated in the drift region extends at least to below a portion of a base of the trench structure, and the vertical field effect transistor further includes at least one of the following two features (a)-(b):
       (a) the laterally extending area is at least partially positioned directly under a lowest point of the trench structure; and
       (b) the vertical field effect transistor further comprises an additional trench structure that is offset in a plane with respect to the trench structure, so that the source/drain electrode is situated between the trench structure and the additional trench structure, the shielding structure including an additional laterally extending area that is situated in the drift region and extends laterally at least to below a portion of a base of the additional trench structure; and
     (ii) (a) the shielding structure further includes a vertically extending area that extends vertically between the source/drain electrode and the laterally extending area of the shielding structure, and (b) the laterally extending area and the vertically extending area are structured such that, in a cross-sectional view of the vertical field effect transistor, the laterally extending area and the vertically extending area form an 'L'-shape composed of a vertical leg and a horizontal leg, the vertically extending area forming the vertical leg and extending vertically in a direction that is directed from a top side of the vertical field effect transistor towards the drift region, and the laterally extending area forming the vertical leg and extending laterally from the vertical leg in a direction that is directed from an exterior lateral side of the vertical field effect transistor radially inwards towards a lateral center of the vertical field effect transistor; and
   (III) the vertical field effect transistor further comprises a region that (i) has the first conductivity type, (ii) is formed in the drift region at least below the trench structure, (iii) has a higher dopant concentration than the drift region, and (iv) adjoins the shielding structure.

2. The vertical field effect transistor as recited in claim 1, wherein the III-V heterostructure includes the AlGaN layer, and the GaN layer that adjoins the AlGaN layer.

3. The vertical field effect transistor as recited in claim 2, wherein the drift region is n-conductive, and the shielding structure includes the at least one p-conductive GaN region whose dopant concentration is higher than the dopant concentration of the drift region.

4. The vertical field effect transistor as recited in claim 1, wherein the shielding structure includes the laterally extending area that is situated in the drift region and extends laterally in the direction of the trench structure.

5. The vertical field effect transistor as recited in claim 4, wherein the laterally extending area of the shielding structure situated in the drift region extends at least to below a portion of the base of the trench structure.

6. The vertical field effect transistor as recited in claim 4, wherein the shielding structure further includes the vertically extending area that extends vertically, between the source/drain electrode and the laterally extending area of the shielding structure.

7. The vertical field effect transistor as recited in claim 1, further comprising: the region that (i) has the first conductivity type, (ii) is formed in the drift region at least below the trench structure, (iii) has the higher dopant concentration than the drift region, and (iv) adjoins the shielding structure.

8. The vertical field effect transistor as recited in claim 7, further comprising:
   an additional shielding structure, having the second conductivity type, which is situated in the region formed at least below the trench structure, the additional shielding structure being situated at least partially below the trench structure and being separated from the shielding structure by the region that is formed at least below the trench structure.

9. The vertical field effect transistor as recited in claim 5, further comprising:
   the additional trench structure that is offset in the plane with respect to the trench structure, so that the source/ drain electrode is situated between the trench structure and the additional trench structure, the shielding structure including the additional laterally extending area that is situated in the drift region and extends laterally at least to below the portion of the base of the additional trench structure.

10. The vertical field effect transistor as recited in claim 9, wherein the area of the shielding structure situated in the drift region and the additional area of the shielding structure situated in the drift region are offset relative to one another in a trench direction.

11. A method for forming a vertical field effect transistor, the method comprising the following steps:
  forming a drift region having a first conductivity type;
  forming a trench structure on or above the drift region, the trench structure including at least one side wall at which a field effect transistor (FET) channel region is formed, the FET channel region including a III-V heterostructure for forming a two-dimensional electron gas at a boundary surface of the III-V heterostructure;
  forming a shielding structure that is situated laterally adjacent to the at least one side wall of the trench structure and extends vertically into the drift region or vertically further in a direction of the drift region than the trench structure, the shielding structure having a second conductivity type that differs from the first conductivity type; and
  forming a source/drain electrode that is electroconductively connected to the III-V heterostructure of the trench structure and to the shielding structure;
  wherein the vertical field effect transistor formed by the method includes at least one of the following four features (I)-(III):
    (I) (i) the III-V heterostructure includes an AlGaN layer and a GaN layer that adjoins the AlGaN layer, (ii) the drift region is n-conductive, and (iii) the shielding structure includes at least one p-conductive GaN region whose dopant concentration is higher than a dopant concentration of the drift region;
    (II) the shielding structure includes a laterally extending area that is situated in the drift region and extends laterally in a direction of the trench structure, and the vertical field effect transistor further includes at least one of the following two features (i)-(ii):
      (i) the laterally extending area of the shielding structure situated in the drift region extends at least to below a portion of a base of the trench structure, and the vertical field effect transistor further includes at least one of the following two features (a)-(b):
        (a) the laterally extending area is at least partially positioned directly under a lowest point of the trench structure; and
        (b) the vertical field effect transistor further comprises an additional trench structure that is offset in a plane with respect to the trench structure, so that the source/drain electrode is situated between the trench structure and the additional trench structure, the shielding structure including an additional laterally extending area that is situated in the drift region and extends laterally at least to below a portion of a base of the additional trench structure; and
      (ii) (a) the shielding structure further includes a vertically extending area that extends vertically between the source/drain electrode and the laterally extending area of the shielding structure, and
        (b) the laterally extending area and the vertically extending area are structured such that, in a cross-sectional view of the vertical field effect transistor, the laterally extending area and the vertically extending area form an 'L'-shape composed of a vertical leg and a horizontal leg, the vertically extending area forming the vertical leg and extending vertically in a direction that is directed from a top side of the vertical field effect transistor towards the drift region, and the laterally extending area forming the vertical leg and extending laterally from the vertical leg in a direction that is directed from an exterior lateral side of the vertical field effect transistor radially inwards towards a lateral center of the vertical field effect transistor; and
    (III) the vertical field effect transistor further comprises a region that (i) has the first conductivity type, (ii) is formed in the drift region at least below the trench structure, (iii) has a higher dopant concentration than the drift region, and (iv) adjoins the shielding structure.

12. The vertical field effect transistor as recited in claim 5, wherein the laterally extending area is at least partially positioned directly under a lowest point of the trench structure.

13. The vertical field effect transistor as recited in claim 6, wherein the laterally extending area and the vertically extending area are structured such that, in the cross-sectional view of the vertical field effect transistor, the laterally extending area and the vertically extending area form the 'L'-shape composed of the vertical leg and the horizontal leg, the vertically extending area forming the vertical leg and extending vertically in the direction that is directed from the top side of the vertical field effect transistor towards the drift region, and the laterally extending area forming the vertical leg and extending laterally from the vertical leg in the direction that is directed from the exterior lateral side of the vertical field effect transistor radially inwards towards the lateral center of the vertical field effect transistor.

* * * * *